(12) United States Patent
Suehiro et al.

(10) Patent No.: US 7,304,326 B2
(45) Date of Patent: Dec. 4, 2007

(54) LIGHT EMITTING DEVICE AND SEALING MATERIAL

(75) Inventors: Yoshinobu Suehiro, Aichi-ken (JP); Hideaki Kato, Aichi-ken (JP); Seiji Takano, Aichi-ken (JP)

(73) Assignee: Toyoda Gosei Co., Ltd., Nishikasugai-gun, Aichi-ken (JP)

( * ) Notice: Subject to any disclaimer, the term of this patent is extended or adjusted under 35 U.S.C. 154(b) by 0 days.

(21) Appl. No.: 11/050,432

(22) Filed: Feb. 4, 2005

(65) Prior Publication Data

US 2005/0173708 A1  Aug. 11, 2005

(30) Foreign Application Priority Data

Feb. 6, 2004  (JP) ............................. 2004-031305
Jul. 30, 2004  (JP) ............................. 2004-223889

(51) Int. Cl.
  *H01L 27/15*  (2006.01)
  *H01L 29/24*  (2006.01)

(52) U.S. Cl. ............................. 257/79; 257/79; 257/81; 257/98; 257/99; 257/100; 257/E33.058; 257/E33.059

(58) Field of Classification Search ................ 257/81, 257/98–100, E33.058, E33.059, 79
See application file for complete search history.

(56) References Cited

U.S. PATENT DOCUMENTS 6,020,067 A * 2/2000 Iwama et al. ............... 428/403
6,806,509 B2 * 10/2004 Yoshino et al. ............. 257/103
6,936,852 B2 * 8/2005 Furukawa et al. ........... 257/79
2001/0033722 A1 * 10/2001 Okada et al. ................ 385/94
2003/0107046 A1 * 6/2003 Waitl et al. .................. 257/81
2004/0125578 A1 * 7/2004 Konishi et al. .............. 361/783
2005/0280016 A1 * 12/2005 Mok et al. ................... 257/99

FOREIGN PATENT DOCUMENTS

| JP | 05-315652 | 11/1993 |
|---|---|---|
| JP | 2002-314142 | 10/2002 |
| JP | 2003-268202 | * 9/2003 |

OTHER PUBLICATIONS

Kwok K. Ng, Complete Guide To Semiconductor Devices, 1995, MCGraw-Hill, Inc., p. 613.*

* cited by examiner

*Primary Examiner*—Jerome Jackson
*Assistant Examiner*—Joseph Nguyen
(74) *Attorney, Agent, or Firm*—McGinn IP Law Group, PLLC

(57) ABSTRACT

A light emitting device has: a light emitting element; a conducting portion to supply power to the light emitting element; an element housing portion that houses the light emitting element therein; and a sealing material that seals the light emitting element housed in the element housing portion. The sealing material contains a transparent resin material and a transparent filler with a thermal expansion coefficient smaller than the transparent resin material, and the transparent filler has a refractive index nearly equal to the transparent resin material.

17 Claims, 7 Drawing Sheets

LIGHT EMITTING DEVICE AND SEALING MATERIAL

The present application is based on Japanese patent application Nos. 2004-031305 and 2004-223889, the entire contents of which are incorporated herein by reference.

BACKGROUND OF THE INVENTION

1. Field of the Invention

This invention relates to a light emitting device that a solid-state device such as an LED (light emitting diode) element is sealed by a sealing material and, particularly, to a light emitting device that can prevent an electrical interference, such as a disconnection in bonding wire and a contact separation, due to a difference in thermal expansion coefficient between a housing for mounting the solid-state element and the sealing material.

2. Description of the Related Art

Japanese patent application laid-open No. 2002-314142 discloses a light emitting device that an LED element is sealed with a transparent resin material.

FIG. 1 is a cross sectional view showing the conventional light emitting device. The light emitting device is composed of a LC (liquid crystal) polymer resin housing 103, a GaN system semiconductor light emitting element 106 mounted on the housing 103, a silicone sealing material 111 covering the GaN system semiconductor light emitting element 106, and leads 101, 102 such as a metal lead frame. The leads 101, 102 are integrated with the LC polymer resin housing 103. The leads 101, 102 are disposed such that its end is close and opposite to each other.

The LC polymer resin housing 103 is composed of a cone-shaped reflection surface 104 and a bottom surface with the leads 101, 102 exposed thereon. The other end of the leads 101, 102 extends to a direction opposite to each other and is drawn out of the LC polymer resin housing 103.

The GaN system semiconductor light emitting element 106 is mounted on the bottom surface of the housing 103. The cone-shaped reflection surface 104 may be an ellipsoidal surface or revolution paraboloidal surface.

The light emitting element 106 is mounted through an adhesive such as Ag paste on the lead 101 at the bottom of the cone-shaped reflection surface 104. The GaN system semiconductor light emitting element 106 is provided with first and second electrodes (not shown) with which the leads 101, 102 are connected through bonding wires 108, 109 such as a gold (Au) wire.

The silicone sealing material 111 filled in the cone-shaped reflection surface 104 contains a phosphor 110. The emission peak wavelength of the light emitting element 106 may be, for example, less than 400 nm, and the phosphor 110 may be excited by primary light of less than 400 nm. Also, the phosphor 110 may be of one type or composed of a red emission phosphor 110A, a green emission phosphor 11B and a blue emission phosphor 110C.

In such a composition, primary light emitted from the GaN system semiconductor light emitting element 106 is externally discharged while being wavelength-converted by the phosphor 110 without being discharged as it is. In other words, the primary light such as ultraviolet light emitted from the light emitting element 106 is wavelength-converted by the phosphor (e.g., the red phosphor 110A, green phosphor 110B and blue phosphor 110C) and discharged as a combined light of secondary lights.

Silicone has a refractive index slightly lower than epoxy resin and therefore it is at a little disadvantage in light extraction from the light emitting element. However, it is less unlikely to be yellowed due to light or heat discharged from the light emitting element, and it can therefore prevent a reduction in light output of the light emitting device caused by the yellowing.

However, the conventional light emitting device has problems as described below.

The silicone sealing material 111 is composed of silicone with a thermal expansion coefficient as large as $200 \times 10^{-6}/°$C. (which is greater than that of epoxy resin). On the other hand, when the LC polymer resin housing 103 and the leads 101, 102 are replaced by $Al_2O_3$ as a ceramic resin material and a metallic pattern formed thereon, they have a thermal expansion coefficient of $8 \times 10^{-6}/°$C. (which is smaller than that of glass epoxy resin). Further, the housing 103 has an opening at the top. As a result, the difference between the housing 103 and silicone sealing material 111 becomes about twenty five times. Therefore, when the light emitting device is treated or operated in high-temperature environments, an upward force will be applied to the silicone sealing material 111 at the bottom corner portion of the cone-shaped reflection surface 104. This may cause an electrical interference such as a disconnection in the bonding wires 108, 109 and a contact separation at the n- and p-electrodes. Furthermore, the sealing property maybe reduced due to the separation between the silicone sealing material 111 and the cone-shaped reflection surface 104 formed on the resin housing 103.

SUMMARY OF THE INVENTION

It is an object of the invention to provide a light emitting device that can prevent the electrical interference such as a disconnection in wire and a contact separation caused by a difference in thermal expansion coefficient between the resin housing and the resin sealing material.

It is a further object of the invention to provide a light emitting device that can prevent the reduction of sealing property caused by a difference in thermal expansion coefficient between the resin housing and the resin sealing material.

It is a further object of the invention to provide a resin sealing material for a light emitting device that can prevent the electrical interference such as a disconnection in wire and a contact separation caused by a difference in thermal expansion coefficient between the resin housing and the resin sealing material.

(1) According to one aspect of the invention, a light emitting device comprises:

a light emitting element;

a conducting portion to supply power to the light emitting element;

an element housing portion that houses the light emitting element therein; and a sealing material that seals the light emitting element housed in the element housing portion, wherein the sealing material comprises a transparent resin material and a transparent filler with a thermal expansion coefficient smaller than the transparent resin material.

(2) According to another aspect of the invention, a light emitting device comprises:

a light emitting element;

a conducting portion to supply power to the light emitting element;

an element housing portion that houses the light emitting element therein; and a sealing material that seals the light emitting element housed in the element housing portion, wherein the sealing material comprises a transparent resin material and a transparent filler with a thermal expansion coefficient smaller than the transparent resin material, and the transparent filler has a refractive index nearly equal to the transparent resin material.

It is preferred that the transparent filler comprises a material with a light transparency proof against light and heat generated from the light emitting element.

It is preferred that the element housing portion is cone-shaped.

It is preferred that the element housing portion is made of a ceramic material.

It is preferred that the sealing material is made of epoxy resin.

It is preferred that the sealing material is made of silicone.

It is preferred that the transparent filler comprises glass.

It is preferred that the sealing material comprises a phosphor.

It is preferred that the sealing material comprises two layers contacted each other, a first layer of the two layers comprises the light emitting device, a second layer of the two layers comprises the phosphor, and the first layer comprises the transparent filler more than the second layer.

(3) According to another aspect of the invention, a light emitting device comprises:

a light emitting element;

a conducting portion to supply power to the light emitting element;

an element housing portion that houses the light emitting element therein; and a sealing material that seals the light emitting element housed in the element housing portion, wherein the sealing material comprises a transparent resin material and a transparent filler with a thermal expansion coefficient smaller than the transparent resin material, and the sealing material comprises a region with a concentration of the transparent filler higher than the other region in the vicinity of the light emitting element.

(4) According to another aspect of the invention, a light emitting device comprises:

a light emitting element;

a conducting portion to supply power to the light emitting element;

an element housing portion that houses the light emitting element therein; and a sealing material that seals the light emitting element housed in the element housing portion, wherein the sealing material comprises a transparent resin material and a transparent filler with a thermal expansion coefficient smaller than the transparent resin material, the transparent filler has a refractive index nearly equal to the transparent resin material, and the sealing material comprises a region with a concentration of the transparent filler higher than the other region in the vicinity of the light emitting element.

It is preferred that the transparent filler comprises a material with a light transparency proof against light and heat generated from the light emitting element.

It is preferred that the concentration of the transparent filler is 50% or more in volume ratio.

(5) According to another aspect of the invention, a sealing material comprises:

a transparent resin material to seal a solid-state element; and a transparent filler, wherein the transparent filler has a refractive index nearly equal to the transparent resin material, and the transparent filler comprises a material with a light transparency proof against light and heat generated from the solid-state element.

It is preferred that the refractive index is within ±0.025 to the refractive index of the transparent resin material.

It is further preferred that the refractive index is within ±0.010 to the refractive index of the transparent resin material.

It is preferred that the transparent filler comprises an average particle size of 10 to 100 micrometers.

<Advantages of the Invention>

In the invention, since the sealing material contains the transparent resin material and the transparent filler with a thermal expansion coefficient smaller than the transparent resin material, even when the light emitting device is operated in high-temperature environments, the upward force applied to at the bottom corner portion of the cone-shaped reflection surface formed on the LED housing portion can be reduced. Therefore, an electrical interference such as a disconnection in bonding wire and a contact separation can be prevented. Also, the separation of the sealing material from the cone-shaped reflection surface can be prevented.

Since as described above the sealing material contains the transparent filler with a thermal expansion coefficient smaller than the transparent resin material, even when the cone-shaped LED housing portion is cut along the cut line, the sealing material is less likely to be separated from the cone-shaped LED housing portion.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

First Embodiment

Figure 1:
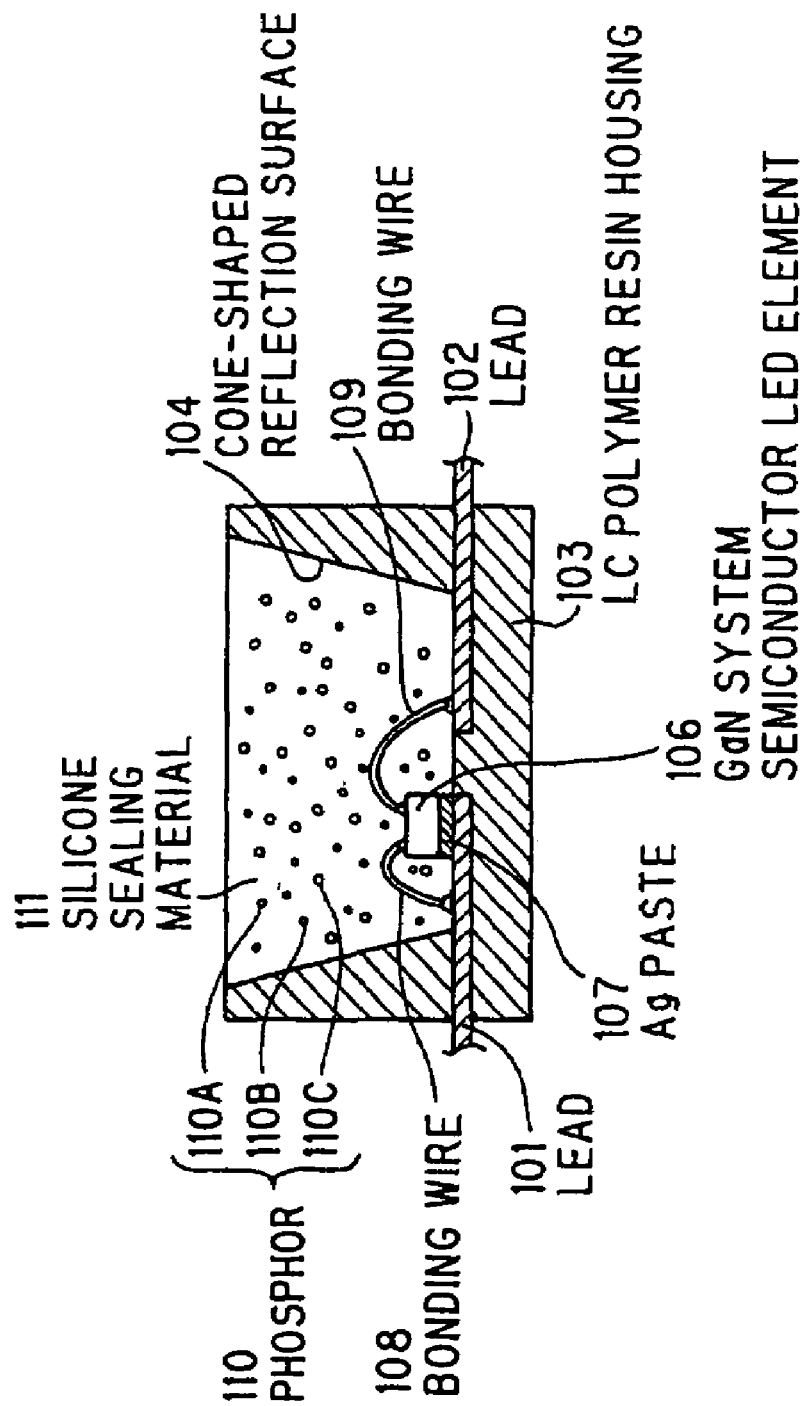
FIG. 1 is a cross sectional view showing the conventional light emitting device.
Figure 2:
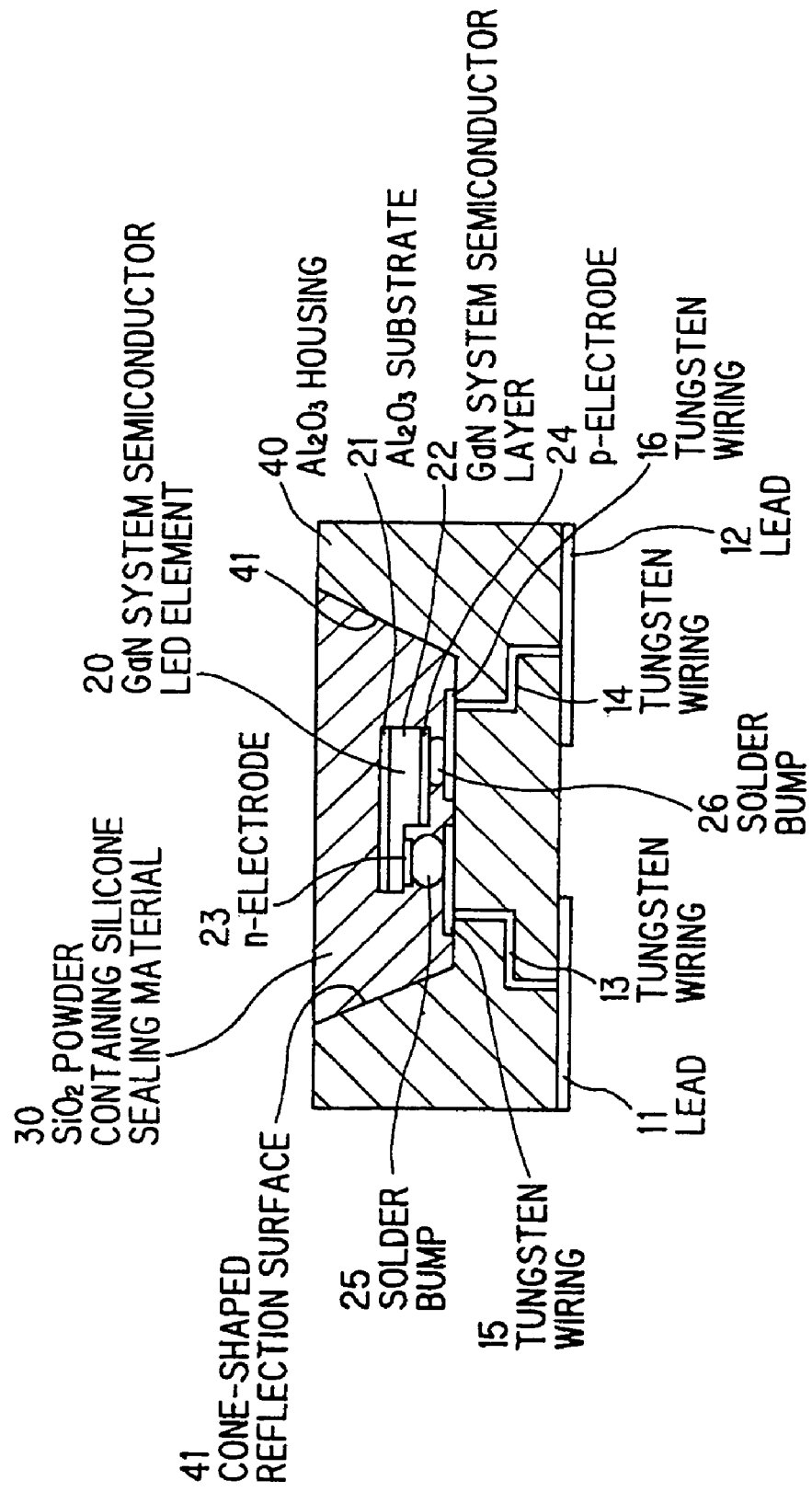
FIG. 2 is a cross sectional view showing a light emitting device in a first preferred embodiment according to the invention.

FIG. 2 is a cross sectional view showing a light emitting device in the first preferred embodiment according to the invention.

The light emitting device is composed of a ceramic (Al$_2$O$_3$) housing 40, a GaN system semiconductor light emitting element 20, and a silica glass powder containing silicone sealing material 30 that SiO$_2$ (silica glass with a refractive index of n=1.46) powder is as a filler mixed into silicone (with a refractive index of n=1.46).

The Al$_2$O$_3$ housing 40 is provided with a cone-shaped reflection surface 41 metallized, and tungsten wirings 15, 16 as a conducting portion formed by printing at the bottom so as to form a mounting part. The tungsten wirings 15, 16 are electrically connected with leads 11, 12 at the back face of the Al$_2$O$_3$ housing 40 through tungsten wirings 13, 14 at the wall of via holes. The Al$_2$O$_3$ housing 40 may be formed concave other than having the cone-like slope as shown in FIG. 2.

The GaN system semiconductor light emitting element 20 is composed of a sapphire (Al$_2$O$_3$) substrate 21, GaN system semiconductor layers 22 epitaxially grown on the substrate 21 (e.g., n$^+$-GaN layer, n-GaN layer, MQW layer (i.e., a multiquantum well structure composed of GaN barrier layer and InGaN well layer and having a peak emission wavelength of 460 nm), p-AlGaN layer, and p$^+$-GaN layer), an n-electrode 23 formed on the n$^+$-GaN layer, and a p-electrode 24 formed on the p$^+$-GaN layer. The n-electrode 23 and the p-electrode 24 are connected with the tungsten wirings 15, 16 through solder bumps 25, 26. Thus, the light emitting element 20 is mounted on the bottom surface of the Al$_2$O$_3$ housing 40 through the cone-shaped reflection surface 41.

The silica glass powder containing silicone sealing material 30 is prepared such that 90 weight part of SiO$_2$ powder is mixed with 100 weight part of silicone.

The silica glass powder has a particle size of about 1 μm, a melting point of about 2000° C. and a thermal expansion coefficient of 0.65×10$^{-6}$/° C. It is not deteriorated or colored by visible light and ultraviolet light.

In the first embodiment, although the top surface of the silicone sealing material 30 as the light discharge face is opened to provide such a structure that the material volume can be moved by thermal expansion, the silica glass powder containing silicone sealing material 30 can prevent the electrical interference of the GaN system semiconductor light emitting element 20 and the interface separation between itself and the cone-shaped reflection surface 41, since the sealing material 30 contains the silica glass powder with a thermal expansion coefficient significantly smaller than that of silicone in the sealing material 30.

Further, since the silica glass powder has the same refractive index as silicone, the entire sealing material 30 can have a transparency with a high liner transmission property even when the silica glass filler is mixed into the sealing material 30. Namely, it can be avoided that the silica glass powder containing silicone sealing material 30 is clouded and thereby light emitted from the light emitting element is reflected back in the light emitting element to be subjected to the internal absorption without being discharged from the silica glass powder containing silicone sealing material 30.

In the light emitting device of the first embodiment, the silica glass powder containing silicone sealing material 30 may be replaced by a transparent filler containing silicone sealing material that SiO$_2$—B$_2$O$_3$ glass (with a refractive index of n=1.52, a thermal expansion coefficient of 5×10$^{-6}$/° C., and an average particle size of about 50 μm) is as a transparent filler mixed into silicone (with a refractive index of 1.52).

The SiO$_2$—B$_2$O$_3$ glass containing silicone sealing material has a reflective index higher than that of the silica glass powder containing silicone sealing material 30. Even in this case, by selecting a silicone material with a higher refractive index corresponding to the transparent filler with a higher refractive index, the light discharge property from the light emitting element can be enhanced.

Second Embodiment

Figure 3:
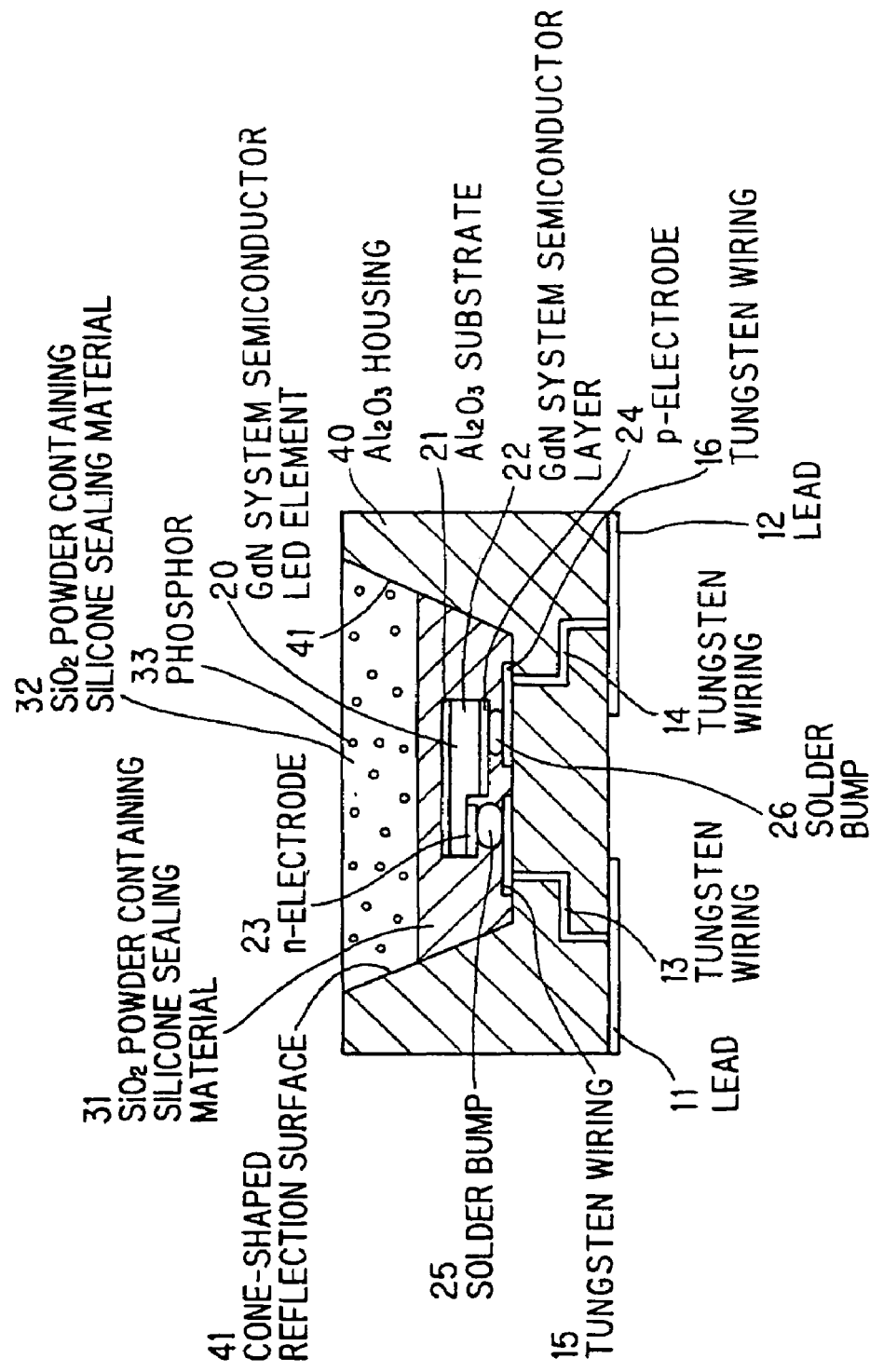
FIG. 3 is a cross sectional view showing a light emitting device in a second preferred embodiment according to the invention.

FIG. 3 is a cross sectional view showing a light emitting device in the second preferred embodiment according to the invention. In FIG. 3, like components are indicated by the same numerals as used in FIG. 2 and the explanations thereof are omitted below.

The light emitting device of the second embodiment is composed of the ceramic (Al$_2$O$_3$) housing 40, the GaN system semiconductor light emitting element 20, and SiO$_2$ (silica glass) powder containing silicone sealing materials 31, 32.

The ceramic (Al$_2$O$_3$) housing 40 and the GaN system semiconductor light emitting element 20 are the same as described in the first embodiment in FIG. 2.

The silica glass powder containing silicone sealing material 31 of lower layer is made of the silica glass powder containing silicone as described in the first embodiment in FIG. 2. The silica glass powder containing silicone sealing material 32, which is formed on the lower silica glass powder containing silicone sealing material 31, is made of the silica glass powder containing silicone as described in the first embodiment in FIG. 2 and further a phosphor 33 that generates yellow light when it is excited by light with a 460 nm peak wavelength emitted from the GaN system semiconductor light emitting element 20. As a result, white light is generated by the combination of light with the 460 nm peak wavelength and yellow light.

In the second embodiment, the silica glass powder containing silicone sealing material 31 can have the same effects as the silica glass powder containing silicone sealing material 30 in the first embodiment. Namely, the sealing material 31 can prevent the electrical interference of the GaN system semiconductor light emitting element 20 and the interface separation between itself and the cone-shaped reflection surface 41 since the sealing material 31 contains the silica glass powder with a thermal expansion coefficient significantly smaller than that of silicone in the sealing material 31.

On the other hand, the lower silica glass powder containing silicone sealing material 31 contains no phosphor whereas the upper silica glass powder containing silicone sealing material 32, by contrast, contains the phosphor 33. This is because if the phosphor 33 is mixed in one layer of the silica glass powder containing silicone sealing material, the phosphor 33 with a higher specific gravity is deposited at the bottom layer where the light emitting element 20 is located and therefore the emission efficiency of the light emitting element 20 lowers due to the light absorption by the deposition layer.

Thus, in the second embodiment, the sealing material is composed of the two layers such that the upper silica glass powder containing silicone sealing material 32 contains the phosphor 33 and the lower silica glass powder containing silicone sealing material 31 contains no phosphor, so as not to lower the emission efficiency. Namely, phosphors are likely to be deposited because of having a relatively higher specific gravity, and light reaching the phosphor layer deposited at the bottom is likely to be subjected to the internal absorption without being externally discharged.

The upper silica glass powder containing silicone sealing material 32 can prevent the interface separation between itself and the cone-shaped reflection surface 41 since it has a small thermal expansion coefficient. Also, the interface stress between the upper and lower silica glass powder containing silicone sealing materials 31 and 32 can be reduced.

Further, since the upper silica glass powder containing silicone sealing material 32 contains the phosphor 33 with a small thermal expansion coefficient, the entire thermal expansion coefficient can be reduced even when the same amount of silica glass powder is not added thereinto. Namely, the upper silica glass powder containing silicone sealing material 32 may contain the $SiO_2$ powder less than the lower sealing material 31, and it may contain no $SiO_2$ powder in some cases.

When the phosphor is added only to the upper layer composed as the sealing material 30 in the first embodiment, there occurs a difference in thermal expansion coefficient between the upper and lower layers, and therefore an interface stress will be generated between the upper and lower layers although the optical property can be enhanced by the addition of phosphor only to the upper layer. However, the thermal expansion coefficient can be equalized between the upper and lower layers by adjusting the amount of the silica glass and the phosphor in the upper layer and the amount of the silica glass in the lower layer. Thereby, the interface stress between the layers can be removed.

Third Embodiment

Figure 4:
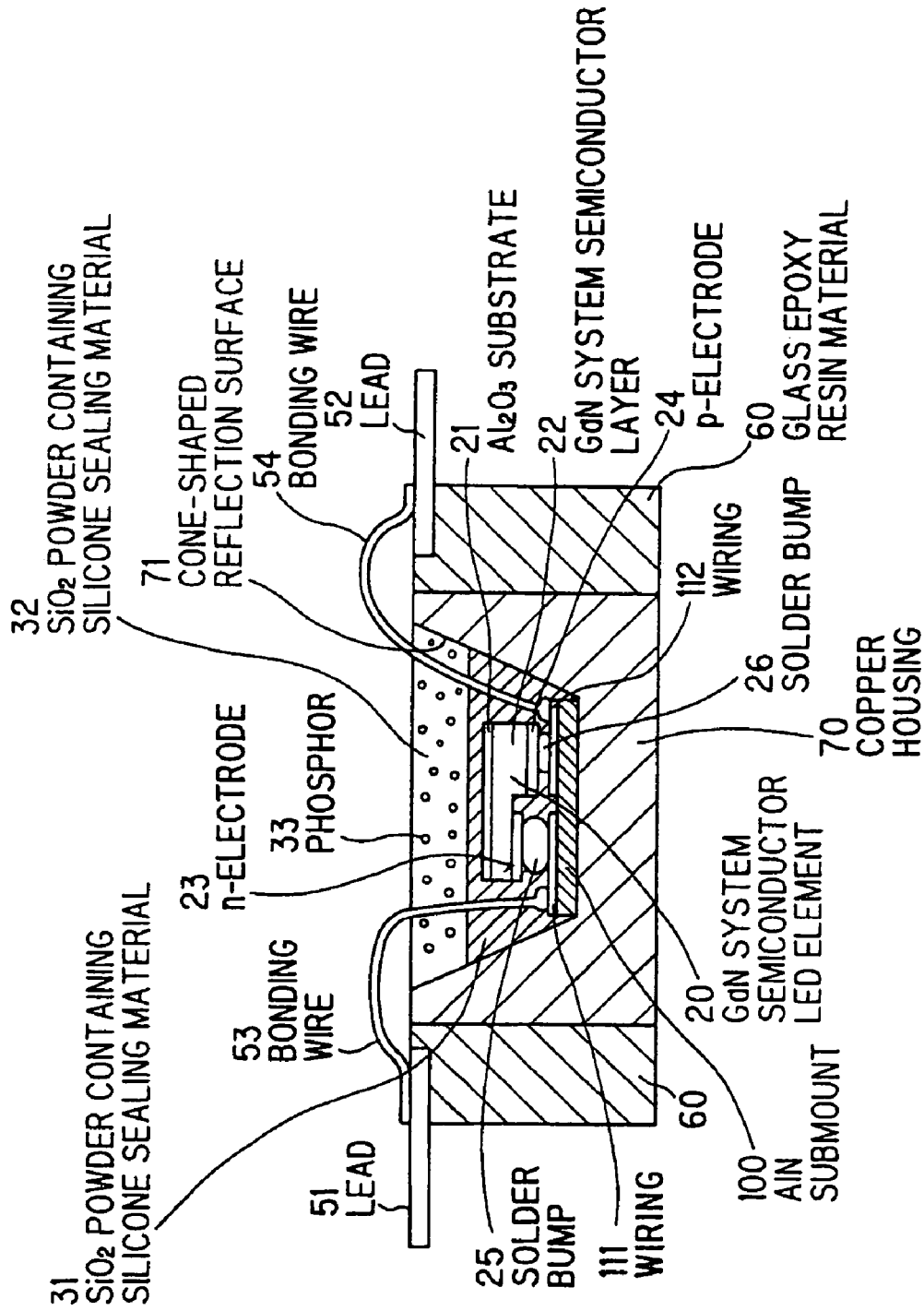
FIG. 4 is a cross sectional view showing a light emitting device in a third preferred embodiment according to the invention.

FIG. 4 is a cross sectional view showing a light emitting device in the third preferred embodiment according to the invention. In FIG. 4, like components are indicated by the same numerals as used in FIG. 2 and the explanations thereof are omitted below.

The light emitting device of the third embodiment is common to that of the second embodiment in FIG. 3 in that it has the GaN system semiconductor light emitting element 20, the lower $SiO_2$ (silica glass) powder containing silicone sealing material 31 and the upper $SiO_2$ (silica glass) powder containing silicone sealing material 32 (with the phosphor contained therein) However, the former is different from the latter in that it has a copper housing 70 and a glass epoxy resin material 60 in place of the $Al_2O_3$ housing 40.

In this light emitting device, the copper housing 70 is a cone-shaped reflection surface 71, and it has the glass epoxy resin material 60 formed around there. An AlN submount 100 is provided at the bottom of the cone-shaped reflection surface 71 of the copper housing 70. The AlN submount 100 has wirings 111, 112 formed by printing on the upper surface. The wirings 111, 112 are connected through the solder bumps 25, 26 to the n-electrode 23 and the p-electrode 24 of the GaN system semiconductor light emitting element 20.

The glass epoxy resin material 60 has leads 51, 52 formed on the upper surface, and the leads 51, 52 are connected through bonding wires 53, 54 to the wirings 111, 112 of the AlN submount 100.

The copper housing 70 has a thermal expansion coefficient of $15.5 \times 10^{-6}/°$ C., which is closer to the thermal expansion coefficient of the silicone, $200 \times 10^{-6}/°$ C. than the thermal expansion coefficient of the $Al_2O_3$ housing 40, $8 \times 10^{-6}/°$ C. Therefore, the amount of silica glass powder in the silica glass powder containing silicone sealing materials 31, 32 can be reduced by that much.

The AlN submount 100 has a thermal conductivity of 180 W/m·k, and therefore heat generated from the GaN system semiconductor light emitting element 20 can be efficiently outward radiated through the copper housing 70.

In the third embodiment, even when the light emitting device is operated in high-temperature environments, the upward force applied to at the bottom corner portion of the cone-shaped reflection surface 71 can be reduced since the silicone sealing materials 31, 32 contain the silica glass powder. Further, the interface stress between the silicone sealing materials 31, 32 can be reduced. Therefore, the electrical interference such as a disconnection in the bonding wires 53, 54 and a contact separation at the n- and p-electrodes 23, 24 can be prevented as well as the first and second embodiments. Also, a reduction in the sealing property can be prevented as well as the first and second embodiments.

Fourth Embodiment

Figure 5:
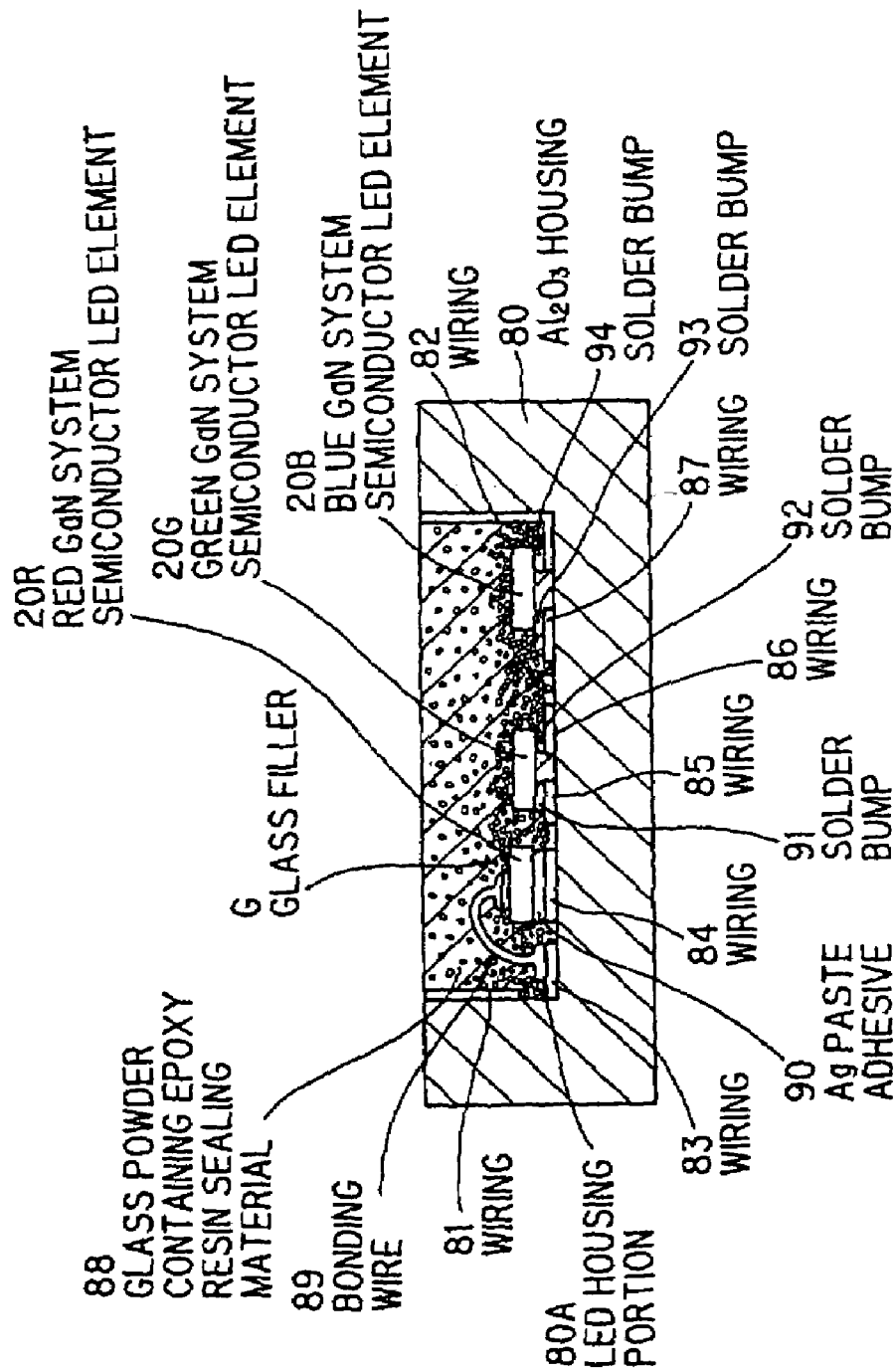
FIG. 5 is a cross sectional view showing a light emitting device in a fourth preferred embodiment according to the invention.

FIG. 5 is a cross sectional view showing a light emitting device in the fourth preferred embodiment according to the invention.

The light emitting device is composed of: a $Al_2O_3$ housing 80 provided with an LED housing portion 80A; red, green and blue GaN system semiconductor light emitting elements 20R, 20G and 20B; and an epoxy resin sealing material 88 that is made of epoxy resin (with n=1.56, and a thermal expansion coefficient of $6.0 \times 10^{-6}/°$ C.) to seal the LED housing portion 80A and contains $P_2O_5$—F system glass. (with n=1.55, and a thermal expansion coefficient of $6 \times 10^{-6}/°$ C.) powder (herein called glass filler G).

The LED housing portion 80A of the $Al_2O_3$ housing 80 has wirings 81 to 87 formed on the surface thereof. The red light emitting element 20R is provided with one electrode (not shown) that is connected through an Ag paste adhesive (conductive) 90 to the wiring 83, and the other electrode (shown without reference number) that is connected through a bonding wire 89 to the wiring 83. The green and blue light emitting elements 20G, 20B are provided with an n-electrode and a p-electrode (neither of them shown) that are connected through solder bumps 91 to 94 to the wirings 85 to 87 and 82.

When the LED housing portion 80A is sealed by the glass powder containing epoxy resin sealing material 88, the glass filler G is deposited as shown in FIG. 5 since the epoxy resin has a low viscosity. Because of this, the concentration of the glass filler G is highly increased in the vicinity of the light emitting element. Thus, the vicinity of the light emitting element is covered with the material (i.e., the glass filler G) with a low thermal expansion coefficient, and a thermal stress is less likely to be generated (i.e., the glass filler G prevents the disconnection of the bonding wire 89).

Although the epoxy resin has an advantage in light extraction from the light emitting element, it may cause deterioration in the vicinity of the light emitting element due to heat or light exposure. In contrast, since the glass filler G is stable to heat or light exposure, a reduction in the light output of the light emitting device of this embodiment can be effectively prevented. If the volume ratio is 1:1 between the epoxy resin and the glass filler G, even when the transparency of the epoxy resin is 40%, a reduction in the entire transparency can be suppressed to 20%. Further, since the glass filler G has a thermal conductivity around three times that of the epoxy resin, the heat radiation property can be enhanced.

In the fourth embodiment, although in the case of the sealing material made of only epoxy resin, a transparency in blue emission will lower due to the yellowing caused by the high optical density blue emission from the blue light emitting element 20B, the lowering of the transparency in blue emission can be prevented since the glass filler G contained as a contraction relaxation material in the epoxy resin offers a stable and high transparency.

The light emitting device of the fourth embodiment can offer various color emissions including white emission at a given output by controlling the light output of the red, green and blue light emitting elements 20R, 20G and 20B. The glass filler G may be subjected to silane coupling (adhesiveness enhancing treatment) such that it has an increased adhesive force to the epoxy resin.

Figure 6:
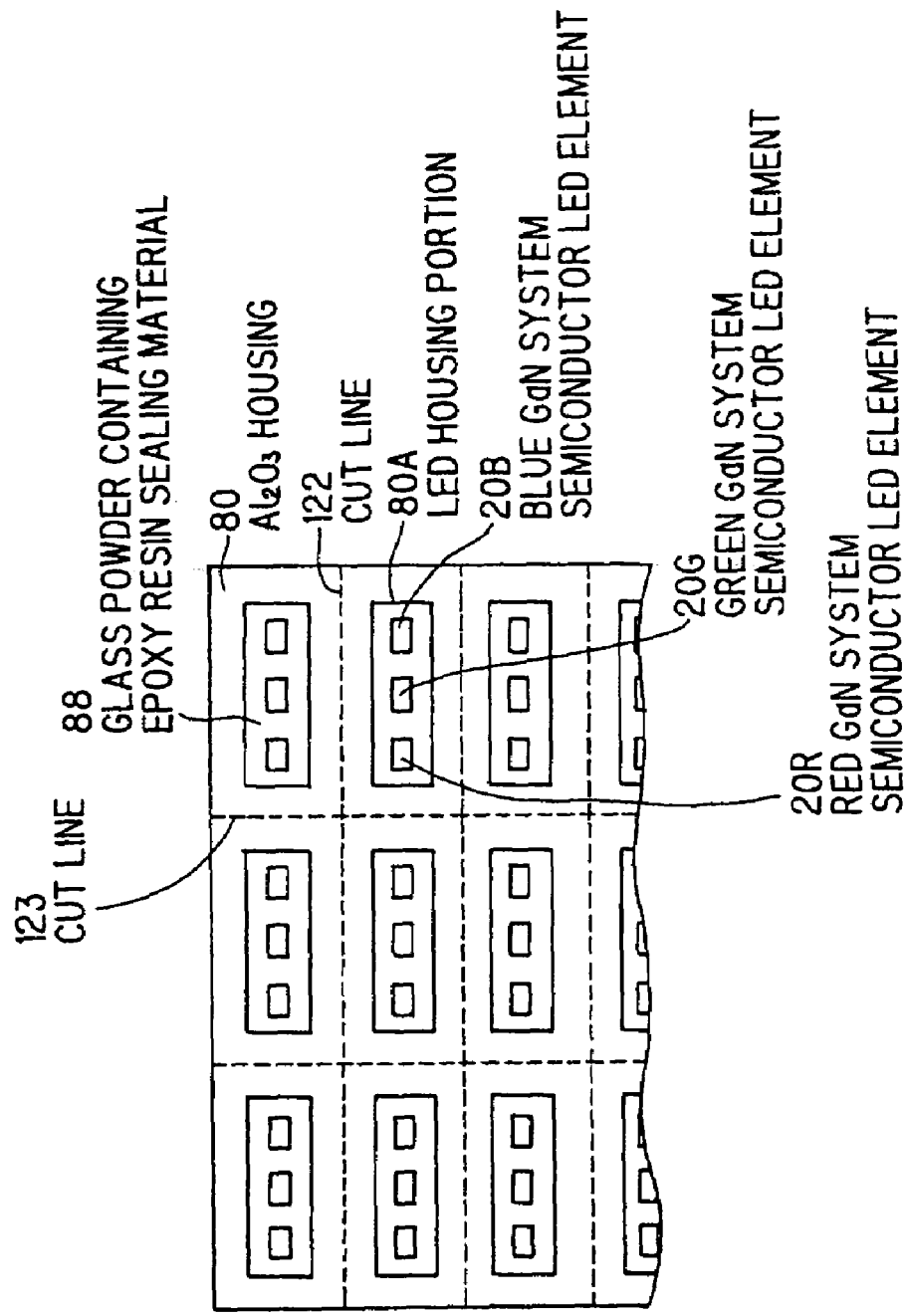
FIG. 6 is a top view showing a process in making the light emitting device of the fourth embodiment.

FIG. 6 is a top view showing a process in making the light emitting device of the fourth embodiment.

This process is on a step before the $Al_2O_3$ housing 80 is cut along cut lines 122, 123. In detail, after the red, green and blue light emitting elements 20R, 20G and 20B are mounted on the LED housing portion 80A, the glass powder containing epoxy resin is filled in the LED housing portion 80A, and then the glass powder containing epoxy resin sealing material 88 is formed by curing.

In the curing step, since the residual stress of the glass powder containing epoxy resin sealing material 88 is reduced by the glass powder (glass filler) with the low thermal expansion coefficient, even when the $Al_2O_3$ housing 80 is cut along the cut lines 122, 123 at a given speed, the separation between the $Al_2O_3$ housing 80 and the glass powder containing epoxy resin sealing material 88 and the disconnection in the light emitting element are not generated. Therefore, it is not necessary to slow down the cut speed in order to prevent the separation or disconnection, and the productivity of the light emitting device can be enhanced by that much.

In filling the glass powder containing epoxy resin sealing material 88 into the opening of the housing 80, the glass powder containing epoxy resin sealing material 88 with a necessary amount of the filler may be supplied thereinto all at once by a dispenser etc. Alternatively, when the viscosity of the sealing material 88 increases due to the filler contained therein so that it is difficult to enter the sealing material into a narrow space, the epoxy resin without the filler can be first entered into the bottom portion of the housing 80 and then the glass powder containing epoxy resin sealing material 88 with the filler can be supplied thereinto. In this case, the filler supplied secondly will be deposited at the bottom.

Figure 7:
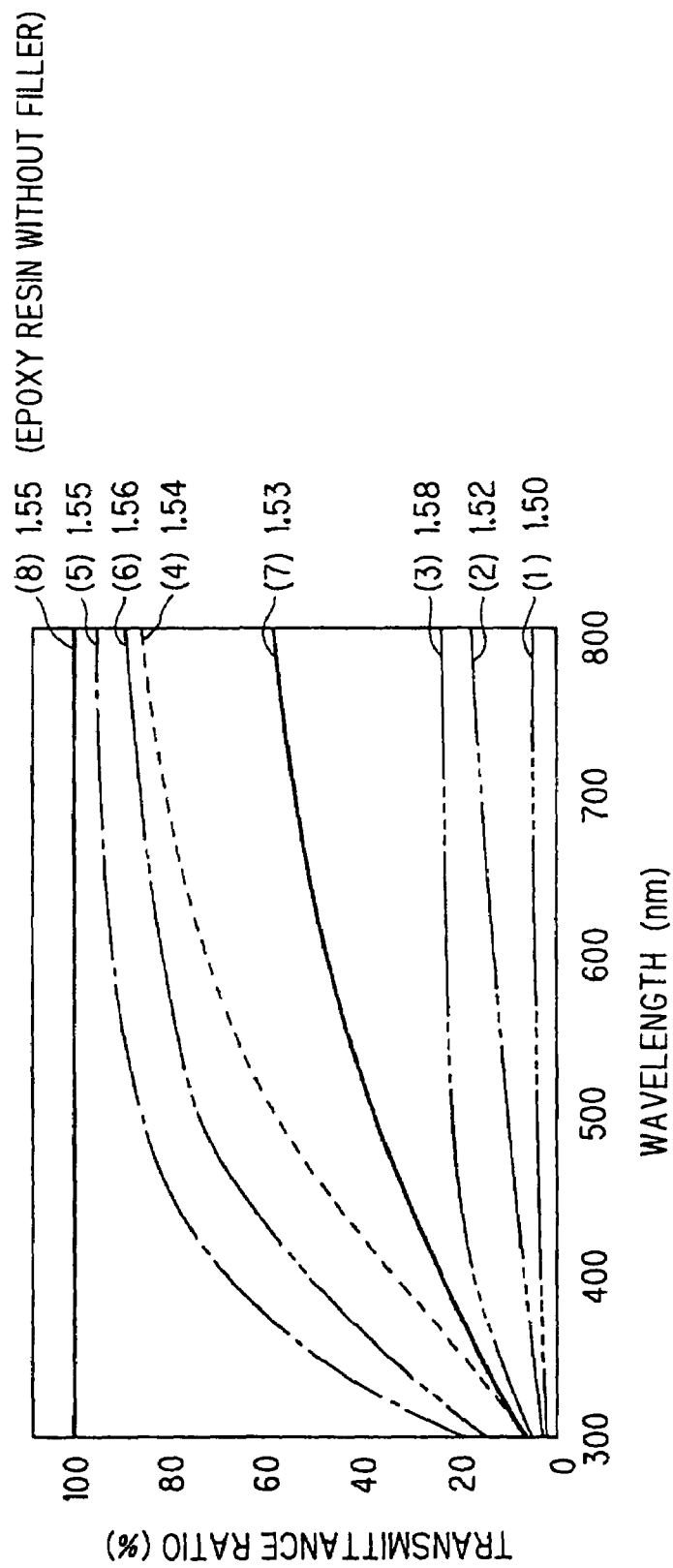
FIG. 7 is a diagram showing a change in optical transmittance to a refractive-index difference between a sealing material and a filler contained in the sealing material.

FIG. 7 is a diagram showing a change in optical transmittance to a refractive-index difference between the sealing material and the transparent filler contained in the sealing material.

FIG. 7 shows the result of measurements that (8) epoxy resin (with a refractive index n=1.55) without filler, and epoxy resins (1) to (7) with glass filler (with refractive indexes (1) 1.50, (2) 1.52, (3) 1.53, (4) 1.54, (5) 1.55, (6) 1.56 and (7) 1.53), where the glass filler and the epoxy resin are mixed 1:3 in weight ratio, are formed into a plate sample and the linear transmittance thereof is measured using light with a wavelength of 300 to 800 nm.

In view of the result, as the refractive index of the glass filler is close to that of the epoxy resin, the linear transmittance becomes close to that of the (8) epoxy resin without filler. In contrast, as the difference of refractive indexes increases, the linear transmittance lowers.

As described above, it is desirable that the refractive-index difference between the filler and the sealing material in the transparent filler containing sealing material of the invention is small as much as possible. However, it is difficult to perfectly equalize the refractive indexes of the filler and the sealing material. Thus, it is a question what range of the refractive-index difference between the filler and the sealing material is acceptable.

When the refractive-index difference between the filler and the sealing material is within ±0.025, there is no significant initial characteristic difference as compared to the case of containing no filler in its optical package. Also, since the scattering on a blue background is unrecognizable in this case, the optical package can be sufficiently used as the transparent filler containing sealing material according to the invention. Therefore, it is desired that the refractive-index difference between the filler and the sealing material is within ±0.025 in the transparent filler containing sealing material according to the invention.

Further, when the refractive-index difference between the filler and the sealing material is within ±0.01, a high linear transmittance can be obtained. Therefore, such an optical package can be used as a light source in collector optics where the size of light source influences the optical characteristics. Although the refractive index is explained herein based on sodium D-line, it may be strictly based on a refractive index at a wavelength used for a light emitting element.

The optical characteristics are also influenced by the amount or the particle diameter of the filler contained therein other than as the refractive-index difference. Namely, the light transmittance is influenced by how often light from the light emitting element passes through the interface between the filler and the resin before being externally radiated.

It is desired that the amount of filler is controlled so as not to cause a problem in stress thereby. The particle diameter of the filler is desirably at least less than the LED size and can provide a uniformity in stress as it decreases. On the other hand, as the particle diameter of the filler decreases, the optical scattering increases. Accordingly, it is desired that the particle diameter of the filler in the filler containing sealing material of the invention is tens of micrometers, preferably 10 to 100 micrometers, more preferably about 50 micrometers.

It is desired that the shape of the filler is with a surface not roughened both in stress and optical aspects, ideally like a sphere.

Although the first to fourth embodiments of the invention address the light emitting device, the invention can be applied to a solar cell element, instead of the light emitting element, so as to have a solar cell element package. In this case, the solar cell element receives light directly from the sun or indirectly light reflected on the cone-shaped reflection surface so as to output a given power based on its power generation function.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A light emitting device, comprising:
    a light emitting element;
    a conducting portion to supply power to the light emitting element;
    an element housing portion that houses the light emitting element therein; and
    a sealing material that seals the light emitting element housed in the element housing portion,
    wherein the sealing material comprises a transparent resin material and a transparent filler with a thermal expansion coefficient smaller than the transparent resin material, said transparent filler having a volume ratio relative to said sealing material sufficient to preclude a thermal expansion sufficient to disrupt an electrical contact from said light emitting element, and the transparent filler has a refractive index nearly equal to the refractive index of the transparent resin material so that the transparent filler does not significantly diffuse light emitted from said light emitting element.

2. The light emitting device according to claim 1, wherein:

the transparent filler comprises a material with a light transparency proof against light and heat generated from the light emitting element.

3. The light emitting device according to claim 1, wherein:

the element housing portion is cone-shaped.

4. The light emitting device according to claim 1, wherein:

the element housing portion comprises a ceramic material.

5. The light emitting device according to claim 1, wherein:

the sealing material comprises epoxy resin.

6. The light emitting device according to claim 1, wherein:

the sealing material comprises silicone.

7. The light emitting device of claim 6, wherein the refractive index of said transparent filler and said silicone is one of:

approximately 1.46, said transparent filler comprising an $SiO_2$ glass; and approximately 1.52, said transparent filler comprising an $SiO_2$—$B_2O_3$ glass.

8. The light emitting device according to claim 1, wherein:

the transparent filler comprises glass.

9. The light emitting device according to claim 1, wherein:

the sealing material comprises a phosphor.

10. The light emitting device according to claim 1, wherein:

the sealing material comprises two layers contacting each other, a first layer of the two layers contacts the light emitting device, a second layer of the two layers comprises a phosphor, and the first layer comprises the transparent filler more than the second layer.

11. The light emitting device according to claim 1, wherein:

the sealing material comprises a region with a concentration of the transparent filler higher than the other region in the vicinity of the light emitting element, and the concentration of the transparent filler is 50% or more in volume ratio.

12. The light emitting device of claim 1, wherein the concentration of the transparent filler is 50% or more in volume ratio.

13. The light emitting device of claim 1, wherein approximately 100 weight parts of said resin material is mixed with approximately 90 weight parts of said transparent filler.

14. A sealing material, comprising:

a transparent resin material to seal a solid-state element; and a transparent filler, wherein the transparent filler has a refractive index nearly equal to the transparent resin material so that said transparent filler does not significantly diffuse light emitted from said solid-state element, and the transparent filler comprises a material with a light transparency proof against light and heat generated from the solid-state element and having a volume ratio relative to said transparent resin material sufficient to preclude a significant thermal expansion.

15. The sealing material according to claim 14, wherein:

the refractive index of the transparent filler is within ±0.025 to the refractive index of the transparent resin material.

16. The sealing material according to claim 14, wherein:

the refractive index of the transparent filler is within ±0.010 to the refractive index of the transparent resin material.

17. The sealing material according to claim 14, wherein:

the transparent filler comprises an average particle size of 10 to 100 micrometers.

* * * * *